(12) United States Patent
Dolman

(10) Patent No.: US 6,894,559 B1
(45) Date of Patent: May 17, 2005

(54) MODULATED POWER SUPPLY

(75) Inventor: Graham Dolman, Saffron Walden (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/675,770

(22) Filed: Sep. 30, 2003

(51) Int. Cl.$^7$ .................................................. H03F 3/38
(52) U.S. Cl. ......................... 330/10; 330/297; 330/251
(58) Field of Search ........................... 330/10, 297, 251, 330/207 A

(56) References Cited

U.S. PATENT DOCUMENTS

| | | | |
|---|---|---|---|
| 4,673,888 A | * | 6/1987 | Engelmann et al. ........... 330/10 |
| 6,636,112 B1 | * | 10/2003 | McCune ....................... 330/10 |
| 6,836,231 B2 | * | 12/2004 | Pearson ....................... 341/143 |

* cited by examiner

Primary Examiner—Patricia Nguyen
(74) Attorney, Agent, or Firm—Barnes & Thornburg

(57) ABSTRACT

A modulated power supply comprises a converter having a primary power switching device and a secondary power switching device. The outputs of the primary and secondary power switching devices are combined to provide an output. A controller controls operation of the switching devices in response to a modulating input signal. Only the primary power switching device is operated while a property of the input signal lies within a first predetermined range and both the primary and the secondary power switching devices are operated while the property of the input signal lies outside the first predetermined range. This can reduce switching losses in comparison to operating the full array of switches. This is particularly well-suited to peaky signals. The property of the modulating input signal which causes the controller to bring secondary power switching devices into operation can be amplitude or rate of change of amplitude.

31 Claims, 9 Drawing Sheets

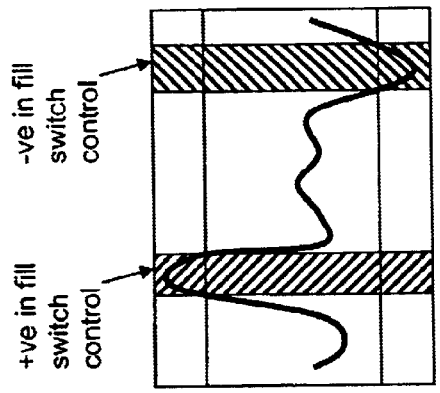
Fig. 6A
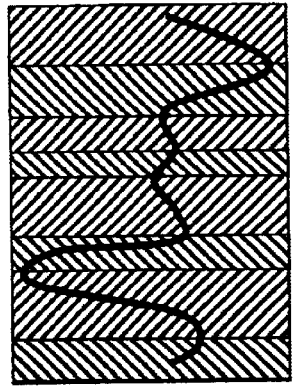
Fig. 6B
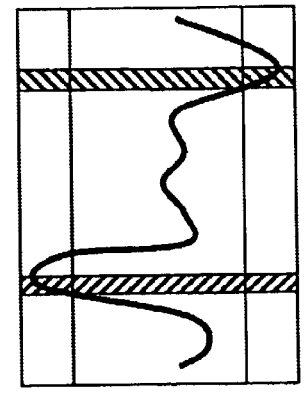
Fig. 6C
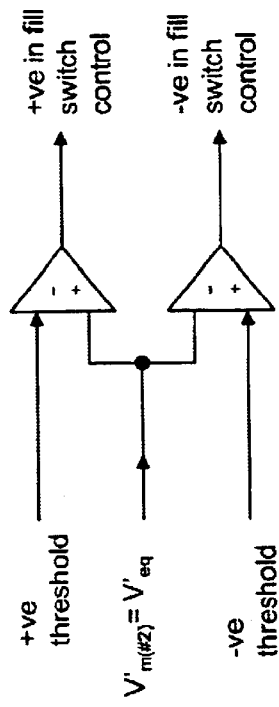
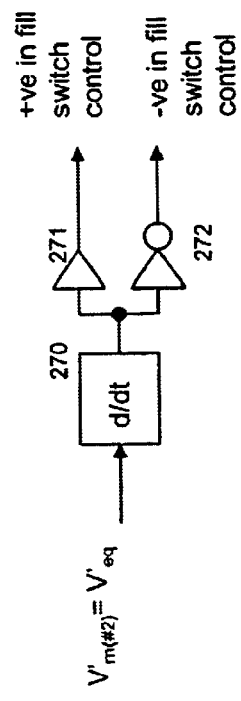
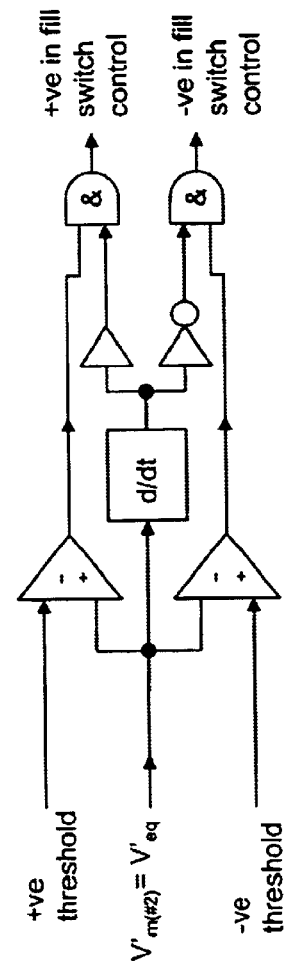

MODULATED POWER SUPPLY

FIELD OF THE INVENTION

This invention relates to modulated power supplies.

BACKGROUND TO THE INVENTION

In the field of power applications, it is common to use linear power amplifiers. While linear power amplifiers operate in a generally linear manner they are known to have a disadvantage of achieving low efficiency. In high power applications, such as the transmit chain of a wireless base station, this requires expensive power devices which consume a considerable quantity of power and require large heatsinks and associated cooling equipment to maintain them at an optimum operating state.

In order to increase the efficiency of a linear power amplifier, it is known to modulate the power supply to the linear power amplifier with the envelope of the signal which is to be amplified. The power supply can be a Pulse Width Modulated (PWM) power supply in which a power switching device, such as a power transistor, is turned on and off at a high frequency, with the width of the 'on' periods varying in sympathy with the amplitude of an input signal. The resulting train of pulses is smoothed by a low pass filter to deliver the amplifier with a power supply which tracks the envelope of the input signal.

The PWM power supply can have a single phase or, more usually, can have multiple phases, with the contributions of individual phases summing to provide an overall output. Multi-phase PWM power supplies have an advantage over single phase PWM supplies in that they can deliver better resolution and increased current. It should be noted that the term 'phase' relates to apparatus for sampling an input signal and operating a switching device. Thus, a multi-phase PWM supply has multiple switching devices which operate at times that are offset from one another.

Switching devices have a finite frequency range over which they can be reliably operated, and begin to work in a non-ideal manner when operated towards the extremes of their operating range. The frequency at which the switching devices in the power supply operate must be greater than the highest frequency in the input signal, to avoid aliasing distortion effects. For an input signal having a wide bandwidth, this requirement forces the switching device to operate in the region towards the upper boundary of its operating range, which incurs switching losses and begins to cause non-ideal behaviour.

As an example, the base stations in a third generation, four channel Universal Mobile Telecommunications System (UMTS) are required to transmit and receive signals having a bandwidth of around 20 MHz, which requires switching devices in the PWM power supply to operate at rates well in excess of this. These rates are at the upper limits of present switching technology. During signal troughs the current demand is low which reduces the negative slew rate capability of the supply and can cause a conventional PWM converter to go into discontinuous operation.

With increasing competition among operators, there is a desire to reduce costs. With power costs being one of the most significant operating costs for base stations, there is a desire to reduce these.

Accordingly, the present invention seeks to provide a power supply which is more efficient in operation.

SUMMARY OF THE INVENTION

A first aspect of the present invention provides a modulated power supply comprising:

a converter having a primary power switching device and a secondary power switching device; the converter having an output which is a combination of the outputs of the primary and secondary power switching devices; and, a controller for controlling operation of the switching devices in response to a modulating input signal, wherein the controller is arranged to operate only the primary power switching device while a property of the input signal lies within a first predetermined range and to operate both the primary power switching device and the secondary power switching device while the property of the input signal lies outside the first predetermined range.

It has been realised that, during normal operation, only some of the switching devices need to be operated. By operating only some of the switching devices during the time that low signal amplitudes are present, there is a reduction in switching losses in comparison to operating the full array of switches. This reduces the overall power consumption of the power supply. This apparatus is particularly well-suited to signals which, in the time domain, have occasional extreme peaks or troughs but usually have an amplitude lying within a narrower band, so called 'peaky' signals.

The property of the modulating input signal which causes the controller to bring secondary power switching devices into operation can be amplitude, with the primary power switching device operating while the amplitude lies within the first predetermined range and the secondary devices being brought into operation when the amplitude exceeds that range. The range can be defined by amplitude thresholds. Preferably, there are a plurality of different amplitude thresholds. In an alternative embodiment, the property of the modulating input signal which causes the controller to bring secondary power switching devices into operation is the slope (rate of change of amplitude) of the modulating input signal, with secondary devices being operated when the slope exceeds a first predetermined range. The range can be defined by thresholds representing a rate of change. Similarly, there can be a plurality of different threshold levels, each defining a range and each having an associated secondary power switching device, or set of devices, which are brought into operation when the property of the modulating signal falls within that range. In a further embodiment, both signal amplitude and rate of change of amplitude of the input signal are monitored to determine when secondary switching devices are operated.

Preferably there are a plurality of primary switching devices. These can be arranged to operate at times which are offset from one another, as in a conventional multi-phase converter.

The controller can be arranged to maintain the secondary power switching device in a continuously on state (100% duty cycle) during the periods when the input signal lies outside the first predetermined range. This minimises switching losses in the secondary power switching device and the number of switching transients which would otherwise result from operating the secondary power switching device in a pulse width modulated manner. A desired output level can be achieved by operating the primary power switching device in a manner which subtracts an unwanted portion of the output level.

Preferably, the primary switching devices operate in a PWM manner but they can also be operated in a pulse density modulated (PDM) or a Sigma Delta Modulated (SDM) manner.

Further aspects of the invention provide a power amplifier, a wireless base station comprising the power amplifier, a control apparatus, a method of operating switching devices in a modulated power supply and a method of generating a power supply signal.

A still further aspect of the invention provides software for implementing a method of controlling operation of switching devices in a modulated power supply. The software can be stored on a suitable storage medium such as an electronic memory device, hard disk, optical disk or other machine-readable storage medium and will be executed by a suitable processing device on the host device. The software may be delivered on a machine-readable carrier or it may be downloaded directly to the host device via a network connection. It will be appreciated that the software may be installed at any point during the life of the host device.

The power supply can be used in a wide range of applications. It is particularly well suited to wireless telecommunications base stations where power amplifiers in the transmit and receive chains are required to amplify a signal having a wide bandwidth and a peaky form. This is particularly true in third generation Universal Mobile Telecommunications System (UMTS) base stations and base stations which are process CDMA or Orthogonal Frequency Division Multiplexed (OFDM) signals.

BRIEF DESCRIPTION OF THE DRAWINGS

Embodiments of the invention will be described with reference to the accompanying drawings in which:

FIGS. 6A–6C show ways of detecting when infilling is required;

DESCRIPTION OF PREFERRED EMBODIMENTS

Figure 1:
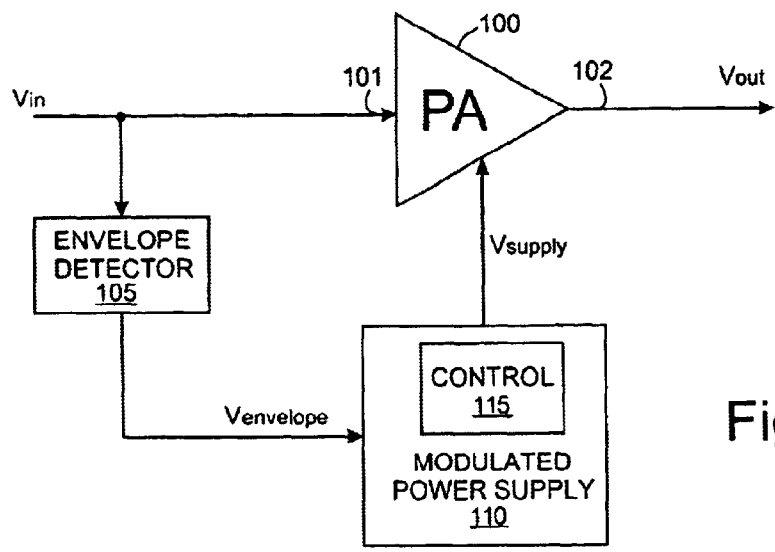
FIG. 1 shows a modulated power supply for a power amplifier.
Figure 2:
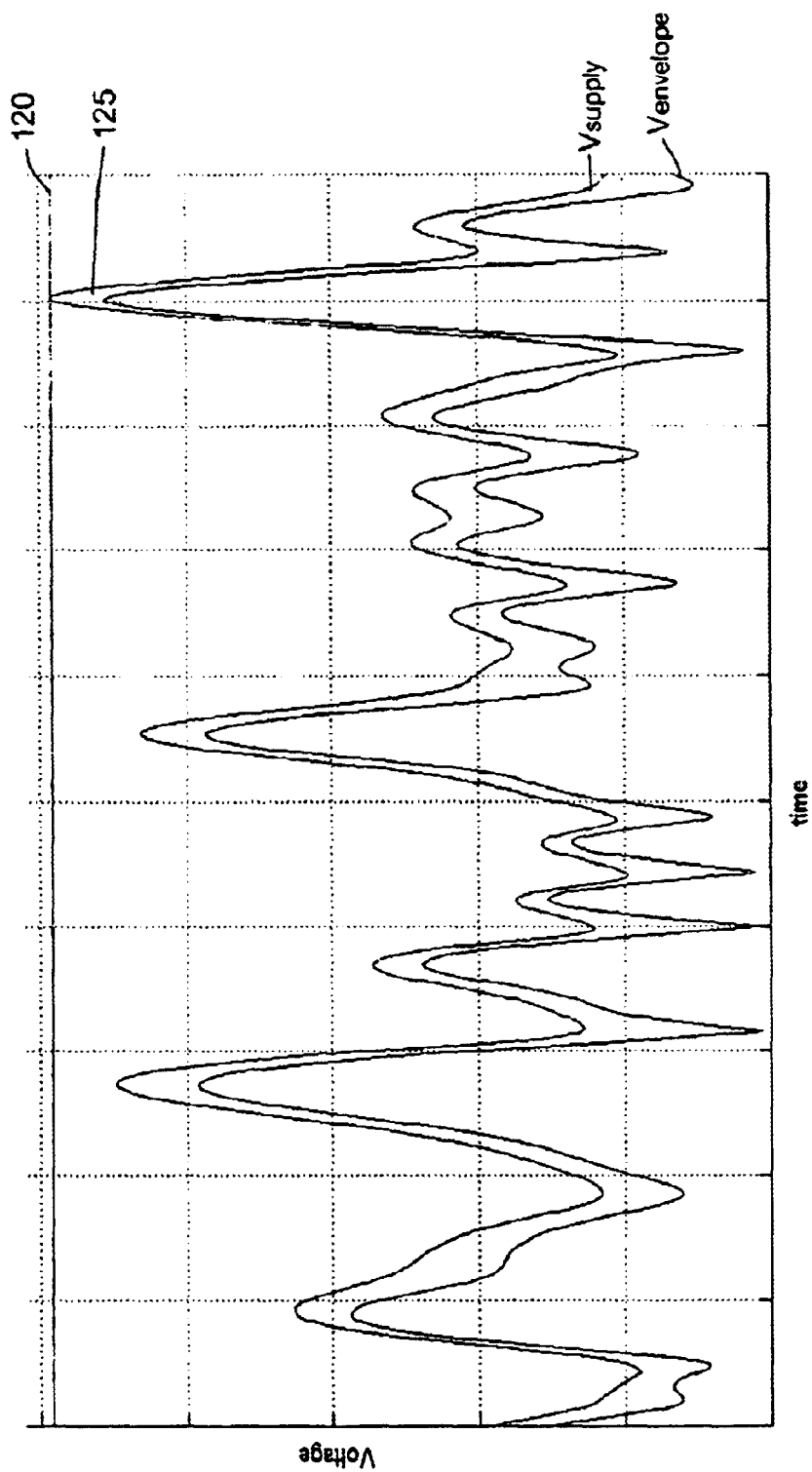
FIG. 2 shows operation of a modulated power supply to track an input signal.

Before describing the invention in detail, FIG. 1 shows a power amplifier arrangement comprising a power amplifier 100 and a modulated power supply 110. An input signal, which is to be amplified by the power amplifier 100, is also applied to an envelope detector 105. A signal, Venvelope, representing the envelope of the input signal is applied to an input of the modulating power supply 110. A control circuit 115 within the modulating power supply 110 receives the input signal and determines appropriate control signals which cause the power supply 110 to generate a supply voltage Vsupply which substantially tracks the envelope of the input signal Vin. The input signal Vin may also be applied to a pre-distortion module (not shown) before being applied to the input to the power amplifier 100. FIG. 2 shows the operation of the power supply over a period of time, showing the envelope of the input signal Venvelope and the envelope of the dynamically modulated power supply voltage Vsupply. It can be seen that the power supply voltage tracks the signal envelope, including peaks 125. As a comparison, the power supply voltage of a fixed supply is shown by line 120. The power supply 110 and control circuit 115 are of the type previously described.

Figure 3:
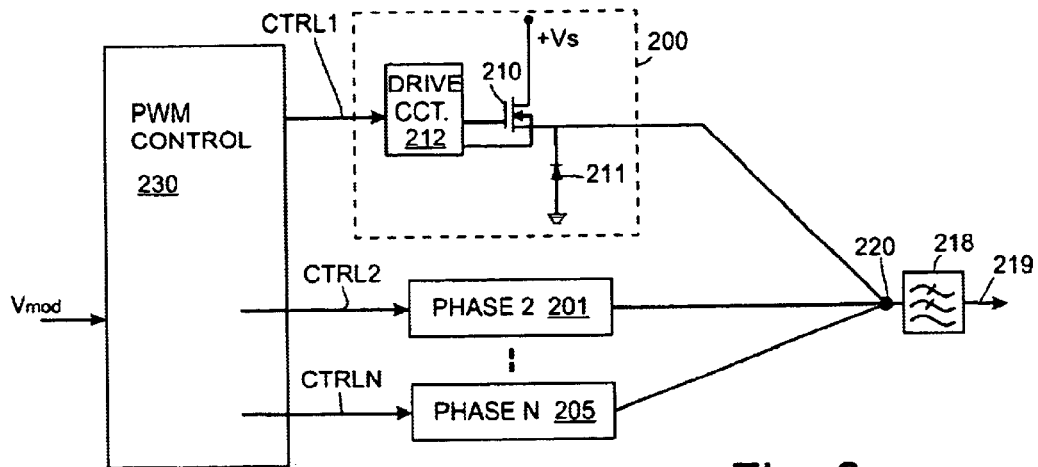
FIG. 3 shows a multi-phase modulated power supply.

In the following embodiments modulating power supply 110 is a pulse width modulated (PWM) converter, and preferably a multi-phase PWM converter. FIG. 3 shows the main blocks within a multi-phase PWM converter 110 with N phases. Phase 1200 is shown in detail and other phases 201, 205 have the same layout. Each phase takes the form of a Buck converter with a power switching device 210, which can be a Field Effect Transistor (FET) or any other suitable switching device. Device 210 is connected between a positive supply rail +Vs and an output. A diode 211 connects between the switching device 210 and ground and provides a bypass path for current when the device is turned off, as is well known. In an alternative form, a phase can have a negative supply rail (−Vs) or two switching devices which are connected in a parallel, 'totem pole' arrangement between a positive supply rail +Vs and a negative supply rail—Vs, with diodes placed in parallel with each device and an output being taken from the point between both devices. Each phase also includes a drive circuit 212. The control signal output by PWM controller 230, which is typically implemented as a FPGA, is at a low level which is unsuitable for directly driving the switching device 210. Therefore, drive circuit 212 converts the control signal to a suitable level for driving the switching device 210. The respective outputs of each phase 200, 201, 205 are summed at a summing point 220. The summed output is passed through a filter 218 to produce a final output 219. A control circuit 230 receives a signal Vmod indicative of the required output and generates a set of control signals CTRL1, CTRL 2, CTRLN which are applied to the switching devices in each of the phases 200, 201, 205. In a known manner, each of the N phases generates a pulsed output which is offset in time from the outputs of other phases and each of the pulsed outputs comprises a stream of pulses which vary in width, the average level of the pulse stream representing a desired output level.

As described previously, in a conventional arrangement each of the phases is operated continuously regardless of the level of the input signal.

Figure 4:
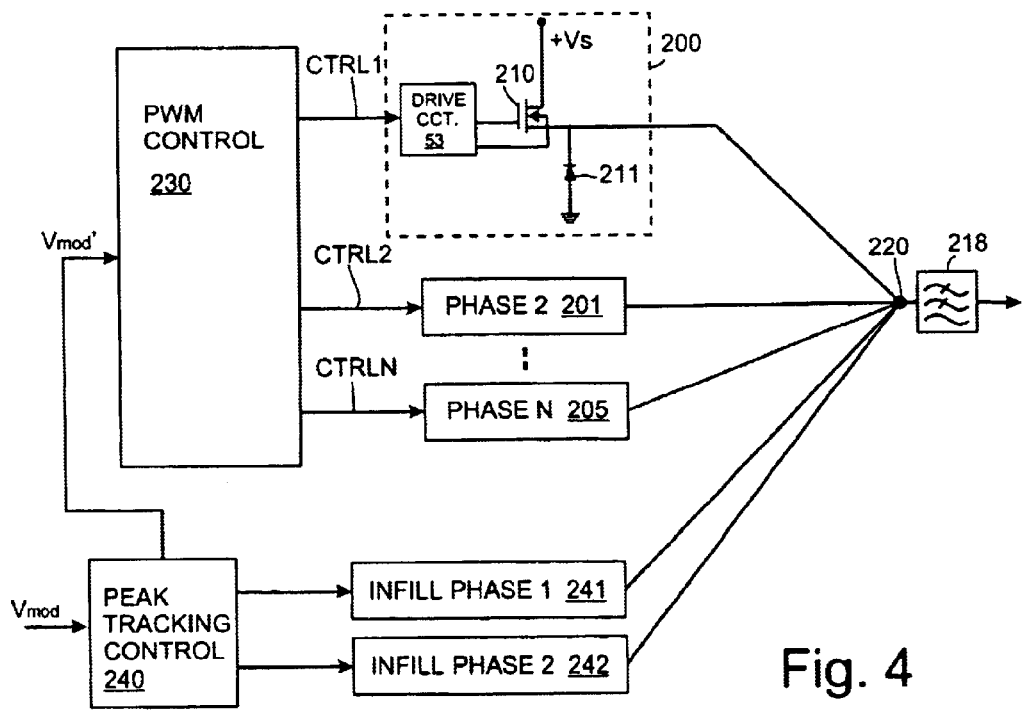
FIG. 4 shows a multi-phase modulated power supply with additional infill phases in accordance with an embodiment of the invention.

FIG. 4 shows the same arrangement as FIG. 3 but with additional phases 241, 242 and a further control unit 240. There may only be one additional phase or a plurality of additional phases, which will be called 'infill' phases. In contrast with FIG. 3, the additional phases 241, 242 are operated on an occasional basis under the control of unit 240. Peak tracking control unit 240 monitors the input signal Vin and determines when the infill phases, should be operated. Vin, or a modified version Vmod' of Vmod is applied to the PWM control circuit as before.

Each infill phase may be capable of operating only during one of: a positive peak or a negative peak, or it may be capable of operating during either. An infill phase which is capable of operating only during a positive peak comprises a single high side switching device/low side diode (shown as inset 413) while an infill phase which is capable of operating only during a negative peak comprises a single low side switching device/high side diode (shown as inset 414). An infill phase which is capable of operating during both types of peak comprises two switching devices in a totem pole arrangement, with a diode in parallel with each switching device, shown as arrangement 412.

Figure 5:
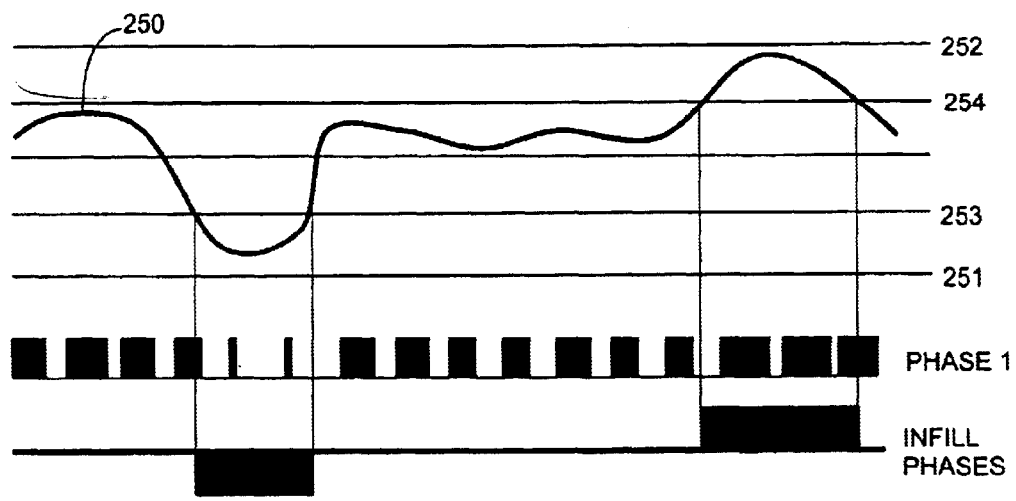
FIG. 5 shows operation of the arrangement of FIG. 4.

In order to illustrate the invention, FIG. 5 shows an example of a 'peaky' signal 250 which the power supply 110 is required to track. A lower 251 and upper 252 extreme of the possible signal range are shown. Two thresholds 253, 254 are also shown. As long as the input signal falls within the band defined by thresholds 253, 254 the main phase (or group of phases, if the supply is multi-phase) operate in a conventional manner. During the time that signal 250 falls below threshold 253 or above threshold 254 an infill phase operates in addition to the main phase(s). Firstly, during the period that signal 250 falls below threshold 253—representing a trough in the signal to be tracked—a first infill phase operates. During the time that signal 250 exceeds threshold 254—representing a peak in the signal—a second infill phase operates, pushing the output to a maximum level. The infill phases give additional peak current capability and allow current to be sunk, thereby allowing the main phases to operate in continuous mode. The manner in which the infill phases operate depends on the type of converter. For a converter of the form shown in FIG. 4, which has a single supply rail (+Vs) and a switching device placed between the supply and an output, the output can take a value between 0V and +Vs. Thus, an infill phase which is required to operate during a trough of the modulating signal drives the output down to 0V. In an embodiment where the output can swing between a positive supply rail (+Vs) and a negative supply rail (−Vs) it will be appreciated that an infill phase which is required to operate during a trough will actually apply a negative going pulse.

For simplicity of this description, only a single phase has been described as operating during each of the signal bands. However, it is preferred that each operating state comprises a multi-phase group of converters.

There are various ways in which the infill phases can operate. In FIG. 5 the infill phases are shown adopting a fixed level for a period of time. Alternatively, they can operate in the same manner as the main phase (i.e. in PWM, PDM or SDM mode) or they can operate in a manner in which the output of the phase adopts a series of stepped levels.

In the example just described, the event which causes infill phases to be brought into or out of operation is an input signal crossing thresholds 253, 254. This is summarised at FIG. 6A. FIGS. 6B and 6C show two further ways of deciding when to bring infill phases into or out of operation. In FIG. 6B the slope of an input signal is detected, such as by a differentiator 270, and an infill phase is brought into operation when the slope exceeds a predetermined threshold value. Similarly, the infill phase can be taken out of operation when the slope falls below the same, or a different, threshold. FIG. 6C shows an embodiment which combines the use of both thresholds and slope detection.

If the additional phase operates in PWM mode, i.e. generating a pulsed output which is proportional to an input signal, then it is reasonably straightforward for PWM controller 230 to calculate what contribution is required by the additional phase and to generate an appropriate control signal for operating the switching device(s) in that phase.

Figure 7:
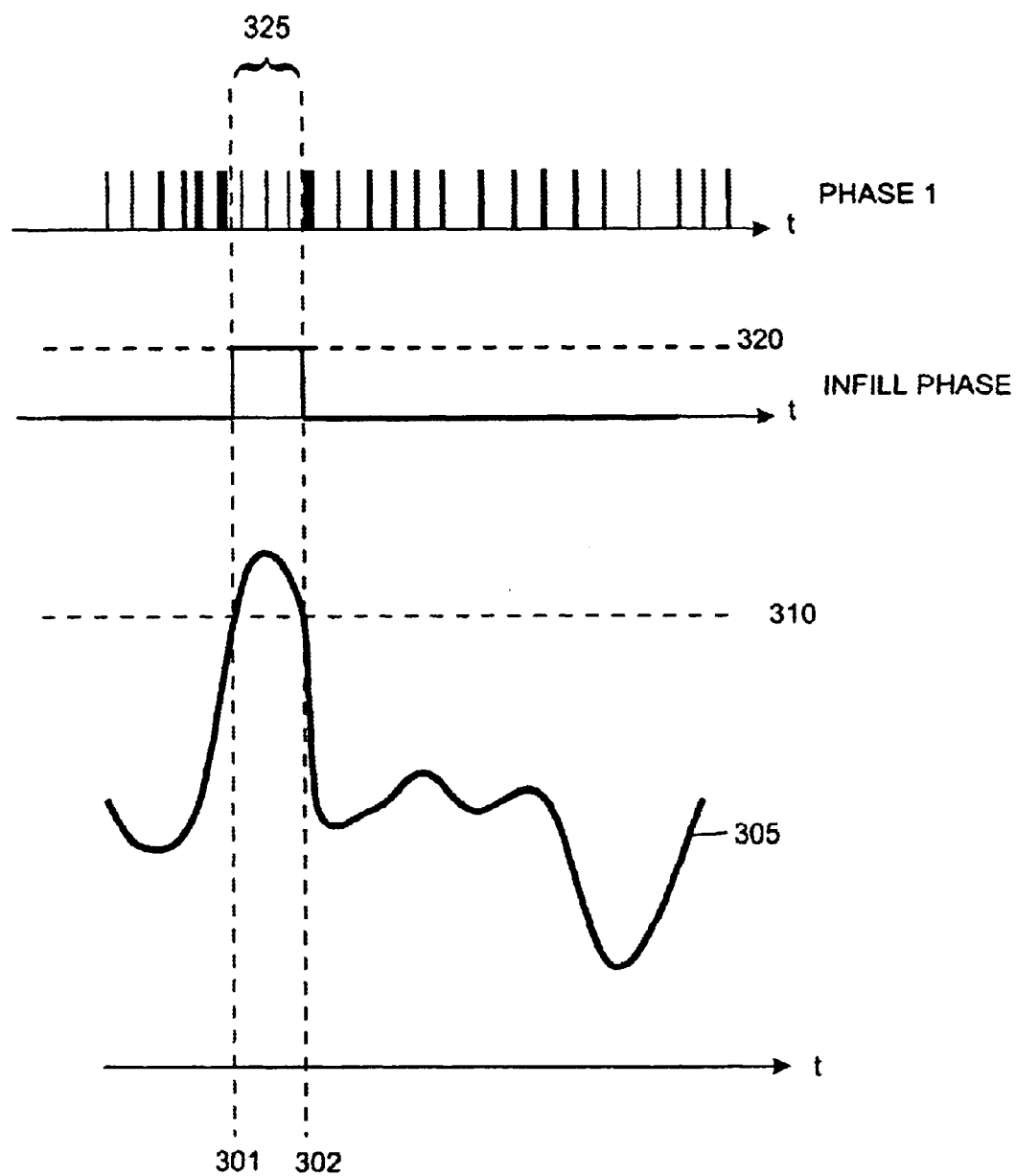
FIG. 7 shows operation of an infill phase which operates at a constant level.

However, where the additional phase operates in a manner in which it adopts a constant value (100% duty cycle) or a stepped value, it is necessary for the operation of other phases to be varied in order to compensate for this. The advantage of having an additional phase operate at a constant value is that it reduces the number of switching transitions. The additional phase simply turns 'on' while other phases operate in a modified way to subtract an unwanted portion of the contribution of the additional phase. This is illustrated in FIG. 7, where a simple power supply has two phases: Phase 1 is a regular, continuously operated, PWM converter and the infill phase is only operated when the input signal 305 exceeds a threshold 310. When the infill phase is operated it provides an output which maintains a constant level 320. During the initial period that the infill phase is operated, the contribution of infill phase is greater than is required and so it can be seen that Phase 1, during the period shown as 325, generates shorter pulses to subtract a portion of the output contributed by the infill phase.

Figure 8:
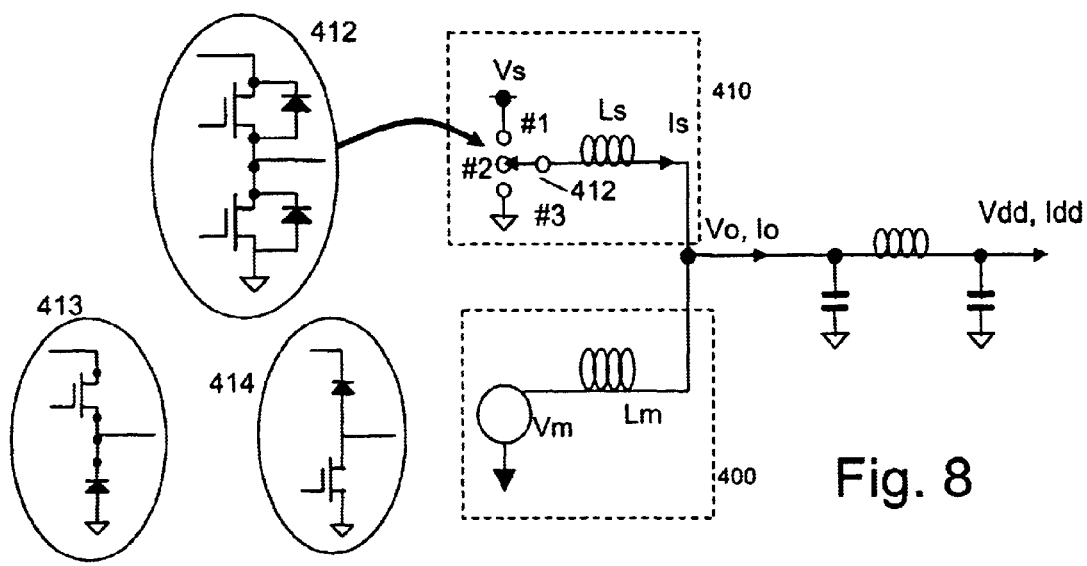
FIG. 8 shows an alternative representation of the arrangement of FIG. 4.

The following describes, in more detail, operation of the PWM converter where the additional phase adopts a fixed level. Referring to FIG. 8, Vm and Lm represent a multi-phase PWM modulator 400 and its combined equivalent output inductance. For the sake of the following analysis, it is assumed that this converter always operates in continuous mode. Continuous mode is an important to the assumption that the converter is well behaved and can be represented as an equivalent voltage source and fixed value inductor. A single in fill converter 410 is shown as a switch 412 with an associated inductor Ls. Switch 412 has three positions labelled as #1, #2, #3. As previously described, in reality multiple switches may be required.

The combined modulator output voltage and current are Vdd and Idd respectively. In general, the load is not fixed and so Idd is not proportional to Vdd. (Of course, in the special case of a fixed load, R, Idd=Vdd/R). The actual voltage and current at the summing node are Vo and Io respectively.

Vdd, Idd, Vo and Io can be related using the transfer characteristics of the filtering elements between Vo and vdd. Any 2 port parameter set such as y parameters or ABCD parameters can be used (the −ve sign accounts for the fact that y parameters are defined with reference to currents flowing into each port):

$$I_o = y_{11}V_o + y_{12}V_{dd}$$

$$-I_{dd} = y_{21}V_o + y_{22}V_{dd}$$

$$\therefore V_o = -I_{dd}/y_{21} - V_{dd}y_{22}/y_{22}$$

$$\therefore I_o = -I_{dd}y_{11}/y_{21} + V_{dd}(y_{12} - y_{11}y_{22}/y_{21}).$$

Using this relationship, Veq, Vm(#1), Vm(#2), Vm(#3) can be expressed in terms of Vdd and Idd:

$$V_{eq} = I_{dd}(-sL_m y_{11}/y_{21} - 1/y_{21}) + V_{dd}(sL_m y_{12} - sL_m y_{11} y_{22}/y_{21} - y_{22} y_{21})$$

$$V_{m(\#1)} = V_{eq}'(-I_{dd}/y_{21} - V_{dd}y_{22}/y_{21} - V_s)(L_m/L_s)$$

$$V_{m(\#2)} = V_{eq}$$

$$V_{m(\#3)} = V_{eq} + (-I_{dd}/y_{21} - V_{dd}y_{22}/y_{21})(L_m/L_s).$$

During operation, switch 412 sits in position #2 for most of the time and Vm acts as a conventional PWM power supply. The switch is activated only on signal peaks to 'boost' the capability of the main power supply 400 either to increase peak current handling capability on positive peaks or to improve slew rate and reduce discontinuous operation on negative peaks (troughs). Consider the case where we wish to 'boost' a positive peak. Before the peak, the switch is set at position #2. The switch will be set to position #1 for some time around the peak. Current will start to ramp up (from zero) in Ls, thereby supplying additional current to the load. When the switch 412 is opened, however, the current in Ls cannot decay instantaneously to zero. Instead, the low side diode (or FET) will conduct (effectively equivalent to position #3) until the current decays to zero. After that, the equivalent circuit reverts to the initial state with switch 412 at position #2.

Figure 9:
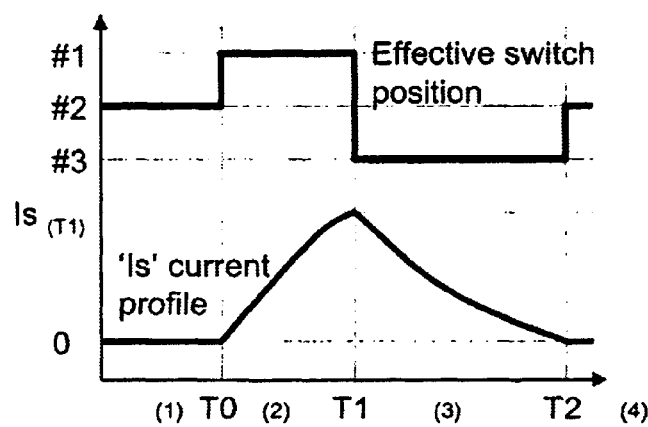
FIGS. 9 and 10 show operation of an infill phase over a period of time.

Referring to FIG. 9, it can be seen that there are 4 phases of boosting a positive peak:

(1) switch at position #2, before the peak boost. Ls is effectively out of circuit;

(2) switch moved to position #1 at time T0; current ramps up in Ls from zero;

(3) switch (effectively) moved to position #3 at time T1; current in Ls decays back to zero;

(4) switch (effectively) moved to position #2 at time T2; circuit reverts back to Ls being effectively out of circuit.

We have shown that Vm, the voltage contributed by the conventional PWM supply, has to be modified depending on which switch phase we are in. This gives rise to Vm(#1), Vm(#2), Vm(#3). Since we control the setting of the switch initially, we know when we are in position #1. When we turn the switch off (from position #1 to an effective position of #3), however, the length of time we are in #3 depends entirely on the time it takes for the current in Ls to decay back to zero. This requires a prediction of the decay time.

From T0 to T1, with switch 412 at position #1:

$$I_s = (V_s - V_o)/sL_s \therefore$$

$$I_{s(t)} = \frac{1}{t_s s}\int_{T0}^{t} (V_s - V_o) dt \therefore$$

$$I_{s(T1)} = \frac{1}{Ls}\int_{T0}^{T1} (V_s - V_o) dt \therefore$$

$$I_{s(T1)} = \frac{1}{Ls}\left\{V_s(T1-T0) - \int_{T0}^{T1} V_o dt\right\}$$

From T1 to T2, with switch 412 effectively at position #3:

$$I_{s(t)} = I_{s(T1)} - \frac{1}{Ls}\int_{T1}^{t} V_o dt \therefore$$

$$I_{s(T2)} = \frac{1}{Ls}\left\{V_s(T1-T0) - \int_{T0}^{T1} V_o dt - \int_{T1}^{T2} V_o dt\right\} \therefore$$

$$I_{s(T2)} = \frac{1}{Ls}\left\{V_s(T1-T0) - \int_{T0}^{T2} V_o dt\right\}$$

These equations show that, providing that we can predict Vo, we can predict the length of time in #3 by equating Is(t) to zero (the current has to have fallen to zero at T2 by definition)

$$I_{s(T2)} = \frac{1}{Ls}\left\{V_s(T1-T0) - \int_{T0}^{T2} V_o dt\right\} = 0$$

A similar relationship exists for negative peak fills (switch sequence #2→#3→#1→#2):

$$I_{s(T2)} = \frac{1}{Ls}\left\{V_s(T2-T1) - \int_{T0}^{T2} V_o dt\right\} = 0$$

Figure 10:
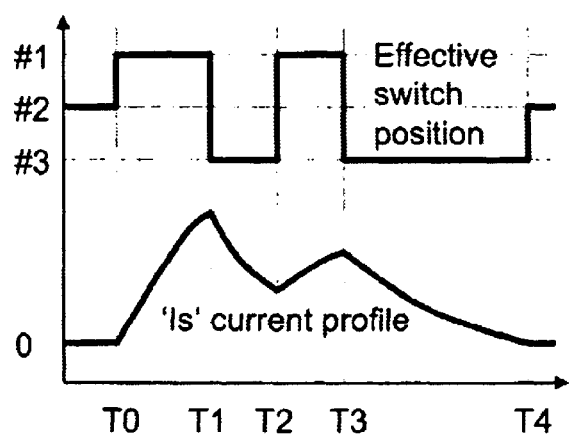

In fact, these equations can be extended for cases where Is does not fall to zero between switches. Referring to FIG. 10, Is at time T4 can be defined as:

$$I_{s(T4)} = \frac{1}{Ls}\left\{V_s(T1-T0) + V_s(T3-T2) - \int_{T0}^{T4} V_o dt\right\} = 0$$

Figure 11:
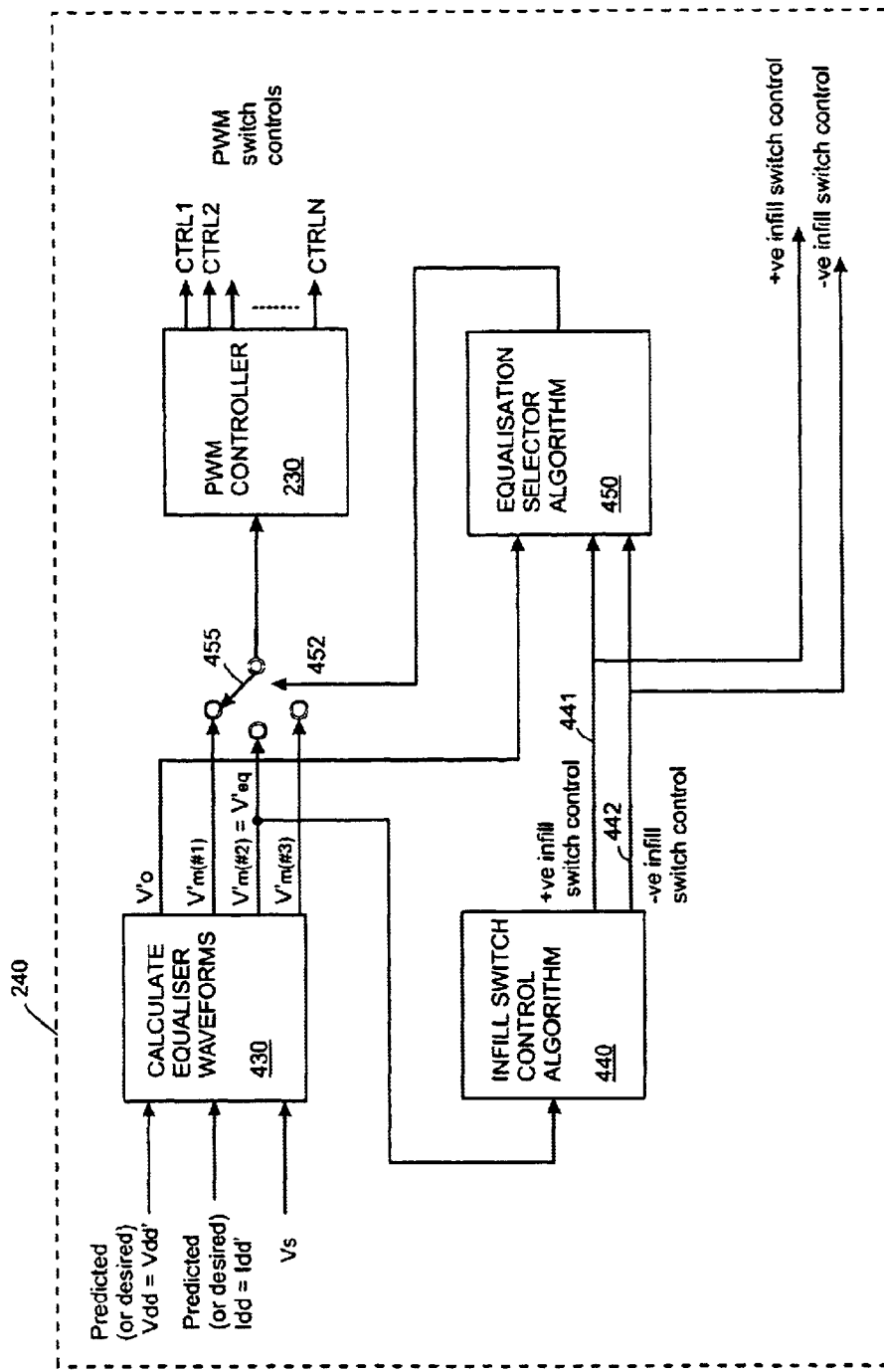
FIG. 11 shows an embodiment of a control function for the modulated supply of FIG. 4.

FIG. 11 shows a way of implementing control of the PWM supply. Block 230 represents the PWM controller, as previously shown in FIG. 3, which is responsible for issuing a set of control signals CTRL1, CTRL2, CTRLN to the switching devices in the conventional single or multi-phase PWM supply. All of the remaining blocks are additionally required to implement control of the in fill phase and to adapt operation of the main PWM supply to compensate for the effect of the in fill phase. An in fill switch control algorithm 440 receives an input which is indicative of the output voltage of the main PWM supply. This unit may operate in one of the ways previously described, i.e. detecting (or predicting) when the amplitude of the voltage will cross a threshold, or the slope of the voltage will exceed a predetermined threshold. The output of unit 440 are control signals 441, 442 for operating the switching devices (e.g. switch 412, FIG. 8) in the in fill phase.

Unit 430 receives the following inputs: Vdd', which is a predicted (or desired) value of Vdd, the combined output voltage of the PWM supply and in fill phase, which is related to Vmod in FIG. 4; Idd', which is a predicted (or desired) value of Idd, and Vs. Using these inputs, unit 430 estimates values for V'o and for V'm(#1), V'm(4#2) and V'm(#3). Each of these values of Vm corresponds to a voltage that the main PWM supply is required to generate, depending on what state the in fill phase is currently in. One of the three possible values of Vm is applied to the PWM controller 230 by a switch 455 under the control of signal 452. Unit 450 is responsible for generating the control signal 452 that selects the appropriate signal Vm that is to be applied to PWM controller 230. Unit 450 receives switch control signals 441, 442, i.e. signals which indicate whether the in fill phase is currently in operation, and an indication of voltage Vo at the summing node. An example of an algorithm used by unit 450 is described below.

Figure 12:
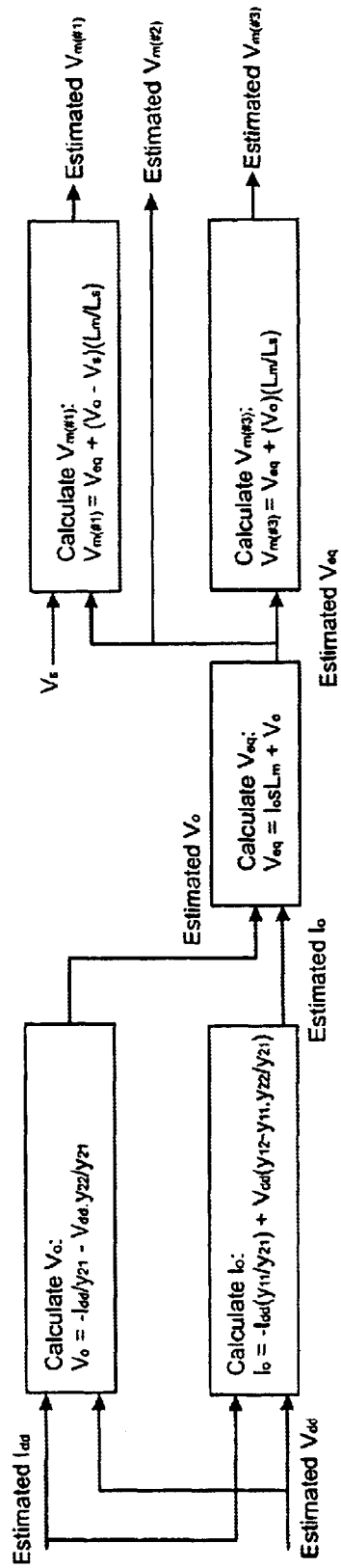
FIG. 12 shows one of the parts of the control function in more detail.

FIG. 12 shows one way of implementing unit 430 to derive the three different values of Vm.

One possible way of implementing the 'equalisation selector algorithm' of unit 450 is as follows:

On receipt of a +ve switch control signal 441, start integrating (To) to evaluate Is:

$$I_{s(T4)} = \frac{1}{Ls}\left\{V_s(T1-T0) + V_s(T3-T2) - \int_{T0}^{T4} V_o dt\right\}$$

Whilst +ve switch control signal 441 is active, select V'm(#1);

Whilst Is is positive but +ve switch control signal 441 is inactive, select V'm(#3);

Once Is returns to zero, reset the integrators to zero and select V'm(#2).

A similar process of opposite polarity will operate on the −ve switch control signal 441.

In the above description a simple case has been described with two thresholds—one above and one below the normal range of the modulating signal—which come into operation when the modulating signal crosses these thresholds. The same techniques can be applied to a system with multiple threshold levels, each threshold representing amplitude, slope or a combination of these. In each case, infill phases are brought into operation when the modulating signal crosses the threshold. As an example, a converter can have a total of nine phases, arranged as phases 1–3, phases 4–6 and phases 7–9.

Phases 1–3 can operate during a low level signal, phases 1–6 can operate during a medium level signal and all of phases 1–9 can operate during a high level signal. The additional groups (phases 4–6, phases 7–9) of phases can operate in the same manner as the primary group, phases 1–3 or in a manner where they adopt a fixed level or stepped level output.

In the embodiments described above, the main phases are pulse width modulated, but they could be pulse density modulated (PDM) or Sigma Delta Modulated (SDM) and operated according to the same principles. Taking the example of PDM, a modulating input signal causes a primary PDM phase to generate a stream of (usually) equal height pulses, with the density of pulses representing the value of the final output signal. An infill phase can be brought into operation to generate an additional PDM stream or to generate a fixed height output. The primary phase can modify its output to compensate for the difference between the desired output signal and that contributed by the infill phase, in the same manner as described previously.

It will be well understood that all of the functions described above can be implemented by software which is executed by a processor, by hardware such as a FPGA or dedicated integrated circuit, or a combination of these.

Figure 13:
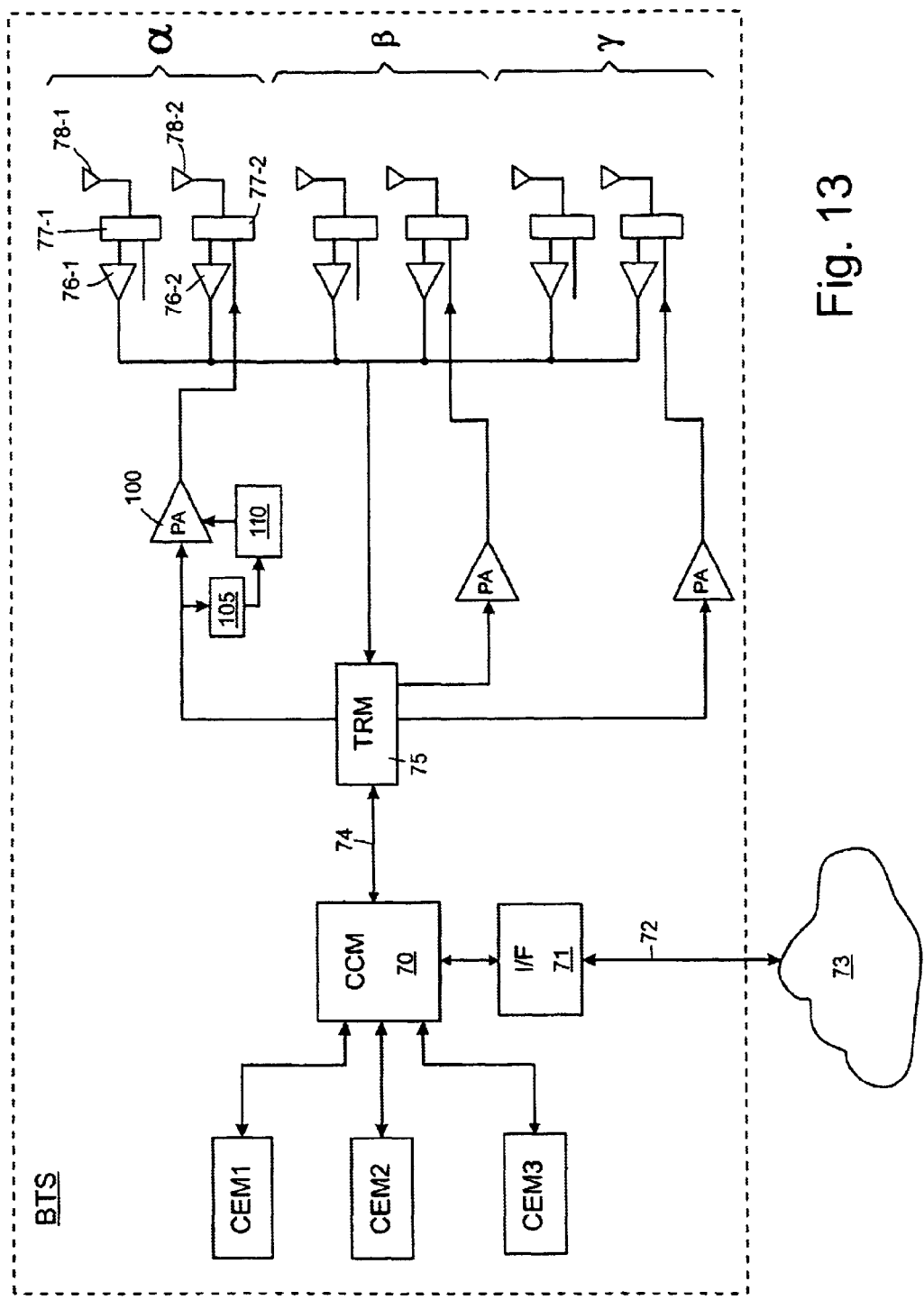
FIG. 13 shows a wireless base station incorporating the modulated power supply.

The techniques described herein are applicable to the control of modulated power supplies used in a wide range of applications. One particularly suitable application is a base station of a wireless communications system which processes wideband signals such as wideband CDMA (W-CDMA) where the envelope of the transmitted signals has a 'peaky' structure. FIG. 13 schematically shows a base station for a wireless communications system, in which the invention can be applied. The baseband section of the base station BTS includes a core switch CCM 70, an interface 71 to the operator's network 73 and a plurality of signal processing units CEM1, CEM2, CEM3. Signals in Packet Data Format including user messages and control signals may be provided on a connection 72 between the network 73 and the BTS, the signals being received at the interface 71 and passed from there to the core switch CCM 70. The core switch 70 is responsible for controlling the complete operation of the transmission and reception of signals to and from the antennas 78 and to and from the signal processing units CEM1, CEM2, CEM3 and the interface 71. The signal processing units undertake baseband signal processing. The core switch CCM 70 is connected 74 to a transceiver unit TRM 75. Transceiver unit TRM 75 performs digital to analog conversion and up-conversion to RF for signals to be transmitted, and performs down-conversion from RF and analog-to-digital conversion on received signals. The arrangement shown has three sectors: α, β and γ. In a typical arrangement, different signals will be transmitted in each sector α, β, γ, e.g. in sector α a signal from a transmit unit in TRM 75 is amplified by power amplifier 100, passed through duplexer 77-2 and transmitted from antenna 78-2. Modulated power supply 110 supplies a power supply to the power amplifier 100 in a manner which tracks the envelope of the signal which is to be transmitted. A control circuit within modulated power supply 110 operates in a manner as previously described, with one or more in fill phases to supplement a continuously operating multi-phase supply.

As noted above, there are other applications of this invention, such as the provision of a power supply to audio amplifiers. In this case, the modulating signal for the power supply will be the envelope signal of an audio signal to be amplified.

The invention is not limited to the embodiments described herein, which may be modified or varied without departing from the scope of the invention.

I claim:

1. A modulated power supply comprising:
   a converter having a primary power switching device and a secondary power switching device; the converter having an output which is a combination of the outputs of the primary and secondary power switching devices; and,
   a controller for controlling operation of the switching devices in response to a modulating input signal, wherein the controller is arranged to operate only the primary power switching device while a property of the input signal lies within a first predetermined range and to operate both the primary power switching device and the secondary power switching device while the property of the input signal lies outside the first predetermined range.

2. A power supply according to claim 1 wherein the controller is arranged to maintain the secondary power switching device in a continuously on state during the periods when it is operated.

3. A power supply according to claim 2 wherein the controller is arranged to operate the primary power switching device in a manner which corrects the difference between the actual output signal, which results from operation of the secondary power switching device, and a desired output signal.

4. A power supply according to claim 1 wherein the controller is arranged to operate the secondary power switching device in a manner in which the output of the secondary power switching device is related to the input signal.

5. A power supply according to claim 4 wherein the controller is arranged to operate the secondary power switching device in one of: a pulse width modulated (PWM), a pulse density modulated (PDM) or Sigma Delta Modulated (SDM) manner.

6. A power supply according to claim 1 wherein the controller is arranged to operate the primary power switching device in one of: a pulse width modulated (PWM), a pulse density modulated (PDM) or Sigma Delta Modulated (SDM) manner.

7. A power supply according to claim 1 wherein there are a plurality of primary power switching devices which are operated together as a group.

8. A power supply according to claim 1 wherein there are a plurality of secondary power switching devices which are operated together as a group.

9. A power supply according to claim 1 wherein there is a further secondary power switching device and the controller is arranged to operate the further secondary power switching device when the input signal lies outside a second predetermined range, the second predetermined range being greater than the first predetermined range.

10. A power supply according to claim 1 wherein the property of the modulating input signal is amplitude.

11. A power supply according to claim 1 wherein the property of the modulating input signal is rate of change of amplitude.

12. A power supply according to claim 1 wherein the modulating input signal is an envelope of a signal for processing by a power amplifier and the output level of the power supply forms a power supply of the power amplifier.

13. A power amplifier comprising an amplifying device and a modulated mode power supply according to claim 1, wherein the amplifying device has an input for receiving an input signal for amplification, wherein an envelope level of the input signal is fed to the power supply as the modulating input signal and the output level of the power supply forms a power supply to the power amplifier.

14. A base station for a wireless communications system comprising a power amplifier according to claim 13.

15. A base station according to claim 14 for use in a wideband communications network, wherein the input signal to the power supply is a wideband communications signal.

16. A control apparatus for controlling operation of switching devices in a modulated power supply which comprises a converter having a primary power switching device and a secondary power switching device, the converter having an output which is a combination of the outputs of the primary and secondary power switching devices, wherein the controller is arranged to operate only the primary power switching device while a property of a modulating input signal lies within a first predetermined range and to operate both the primary power switching device and the secondary power switching device while the property of the input signal lies outside the first predetermined range.

17. A control apparatus according to claim 16 which is arranged to maintain the secondary power switching device in a continuously on state during the periods when it is operated.

18. A control apparatus according to claim 17 which is arranged to operate the primary power switching device in a manner which corrects the difference between the actual output signal, which results from operation of the secondary power switching device, and a desired output signal.

19. A control apparatus according to claim 16 which is arranged to operate the secondary power switching device in a manner in which the output of the secondary power switching device is related to the input signal.

20. A control apparatus according to claim 19 which is arranged to operate the secondary power switching device in one of: a pulse width modulated (PWM), a pulse density modulated (PDM) or Sigma Delta Modulated (SDM) manner.

21. A control apparatus according to claim 16 which is arranged to operate the primary power switching device in one of: a pulse width modulated (PWM), a pulse density modulated (PDM) or Sigma Delta Modulated (SDM) manner.

22. A control apparatus according to claim 16 which is arranged to operate a plurality of primary power switching devices together as a group.

23. A control apparatus according to claim 16 which is arranged to operate a plurality of secondary power switching devices together as a group.

24. A control apparatus according to claim 16 wherein there is a further secondary power switching device and the controller is arranged to operate the further secondary power switching device when the input signal lies outside a second predetermined range, the second predetermined range being greater than the first predetermined range.

25. A control apparatus according to claim 16 wherein the property of the modulating input signal is amplitude.

26. A control apparatus according to claim 16 wherein the property of the modulating input signal is rate of change of amplitude.

27. A computer program product for implementing a method of controlling operation of switching devices in a modulated power supply which comprises a converter having a primary power switching device and a secondary power switching device, the converter having an output which is a combination of the outputs of the primary and secondary power switching devices, wherein the computer program product comprises instructions which are arranged to cause a control apparatus of the converter to operate only the primary power switching device while a property of a modulating input signal lies within a first predetermined range and to operate both the primary power switching device and the secondary power switching device while the property of the input signal lies outside the first predetermined range.

28. A method of controlling operation of switching devices in a modulated power supply which comprises a converter having a primary power switching device and a secondary power switching device, the converter having an output which is a combination of the outputs of the primary and secondary power switching devices, the method comprising:
 operating only the primary power switching device while a property of a modulating input signal lies within a first predetermined range; and,
 operating both the primary power switching device and the secondary power switching device while the property of the input signal lies outside the first predetermined range.

29. A method of generating a power supply signal using a modulated power supply which comprises a converter having a primary power switching device and a secondary power switching device, comprising:
 receiving a modulating input signal;
 operating only the primary power switching device while a property of the modulating input signal lies within a first predetermined range;
 operating both the primary power switching device and the secondary power switching device while the property of the input signal lies outside the first predetermined range; and,
 combining the outputs of the primary and secondary power switching devices to form the output power supply signal.

30. A power supply signal resulting from the method according to claim 29.

31. A modulated power supply comprising:
 a converter having a primary power switching device and a secondary power switching device; the converter having an output which is a combination of the outputs of the primary and secondary power switching devices; and,
 a controller responsive to a modulating input signal which generates control signals to operate the switching devices, wherein a control signal operates only the primary power switching device while a property of the input signal lies within a first predetermined range and control signals operate both the primary power switching device and the secondary power switching device while the property of the input signal lies outside the first predetermined range.

* * * * *